United States Patent [19]
Temple

[11] Patent Number: 5,995,349
[45] Date of Patent: Nov. 30, 1999

[54] PROTECTION DEVICE FOR SOLID STATE SWITCHED POWER ELECTRONICS

[75] Inventor: Victor A. K. Temple, Clifton, N.Y.

[73] Assignee: Harris Corporation, Melbourne, Fla.

[21] Appl. No.: 08/944,513

[22] Filed: Oct. 6, 1997

[51] Int. Cl.[6] .................................................. H02H 3/00
[52] U.S. Cl. ............................................................. 361/94
[58] Field of Search .............................. 361/2, 8, 13, 18, 361/56, 58, 78, 93, 100, 115, 94

[56] References Cited

U.S. PATENT DOCUMENTS 5,307,005  4/1994  Ahladas ..................................... 361/18
5,463,344  10/1995  Temple ..................................... 327/374

*Primary Examiner*—Stephen W. Jackson
*Attorney, Agent, or Firm*—Rogers & Killeen

[57] ABSTRACT

A circuit and method of protecting the antiparallel diodes of a power bridge circuit from stress induced failures caused by the fast operation of the power switches. An auxiliary power switch is provided in parallel to the main power switch which is operable during the reverse recovery of the antiparallel diode, after which the main power switch carries the bulk of the switch current.

4 Claims, 2 Drawing Sheets

PROTECTION DEVICE FOR SOLID STATE SWITCHED POWER ELECTRONICS

BACKGROUND OF THE INVENTION

The present invention generally relates to electrical switch circuits, and in particular to methods and circuits for increasing the turn-on time in switches having a MOS controlled thyristor (MCT) through the innovative use of a thyristor based device.

A thyristor is a four layer semiconductor switching device. The bistable action of a thyristor depends on PNPN regenerative feedback. A thyristor can be unidirectional or bidirectional. A thyristor can be triggered to conduction from a desired point within a quadrant of an applied AC voltage. A triac and silicon bilateral switch are common bidirectional thyristors. The silicon controlled rectifier (SCR) is the most common unidirectional thyristor; others include the gate-turn off switch (GTO) and light activated silicon controlled rectifier (LASCR).

A MOS controlled thyristor is a power semiconductor device that combines a MOS transistor as the gate and a thyristor as the power source. This composite device has the lowest forward voltage drop of any voltage-controlled power source, including power MOS field effect transistors (MOSFET) and insulated gate bipolar transistors (IGBT). MCT's are turned on quickly over their entire active area and have a very large di/dt capability. A description of such devices and explanation of their fabrication process may be found in U.S. Pat. No. 5,111,268 to V. A. K. Temple, which is hereby incorporated by reference. For example, a 600 volt, 75 amp MCT has a di/dt of up to 10,000 amps/microsecond and may be turned on in about 0.2 microseconds. MCT's are used in integrated circuit applications to handle high currents and high voltages. Such applications include high frequency switching regulated power supplies, motor drives and. solid state switches for power electronics building block (PEBB) modules of different configurations for general circuit application.

The most common switch configuration is the half bridge consisting of two switching devices in series, each switching device having an antiparallel diode. Although theoretically, it is desired that the power switch have infinite turn-on speed, the faster such power switch turns on, the faster the antiparallel diode of the series connected switch is turned off. The finite stored charge and the low innate capacitance of power diodes leads to large diode reverse recovery currents and voltage overshoots that often cause failure of the diode. This invention provides a means to effectively provide the appropriate slowing in the turn-on time of a power switch to save the antiparallel diode of the power switch in series therewith. Moreover, this slowing is accomplished by increasing the turn-on time of the power switch without requiring that such means be active in the main part of the power switch cycle.

In applications, particularly half bridges using MCT's as the two main series connected switches, the extremely fast and efficient turn-on of the MCT may stress the antiparallel diode of the series connected MCT beyond the normal capability of such diode and thus induce diode failure by the voltage snap during reverse recovery.

One solution to the diode failure problem is to increase module inductance to limit the rate of change of current di/dt in the power switch. However, this leads to much increased losses and overvoltage stress at turn-off.

Another possible solution, albeit one with some difficulty, can be achieved by making the inductance saturable so that it is high at turn-on and low at turn-off. However, such saturable reactors need careful design and add losses, weight, volume, and cost. They are also limited in temperature capability.

Another possible solution involves a semiconductor based solution which includes paralleling the series connected MCT's with either IGBT's or MOSFET's. The IGET or MOSFET would be turned on before the MCT and used to control the di/dt of the MCT. Unfortunately, this solution requires considerable additional semiconductor area and losses as IGBTs and MOSFETs are far less turn-on and conduction efficient than the MCT.

It is, accordingly, an object of the present invention to provide a novel method and circuit using a thyristor based device to protect a power electronics circuit from failure due to diode stress.

It is another object of the present invention to provide a novel method and circuit to reduce the stress on an antiparallel switch diode during switch turn-on.

It is yet another object of the present invention to provide a novel method and circuit to increase the turn-on time, not the turn-off time, and reducing the di/dt capability of a power electronics switch while retaining the circuit's performance when the switch is fully turned on.

It is still another object of the present invention to provide a novel method and circuit for protecting a power electronics circuits.

It is a further object of the present invention to provide a novel method and circuit for controlling MOS controlled thyristor switches.

It is yet a further object of the present invention to provide a novel MCT power electronics switch having a slower turn-on time and current rate.

It is still a further object of the present invention to provide a novel semiconductor switch having an MCT connected in parallel with a smaller MCT and an inductor, and integrated in a single semiconductor device.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
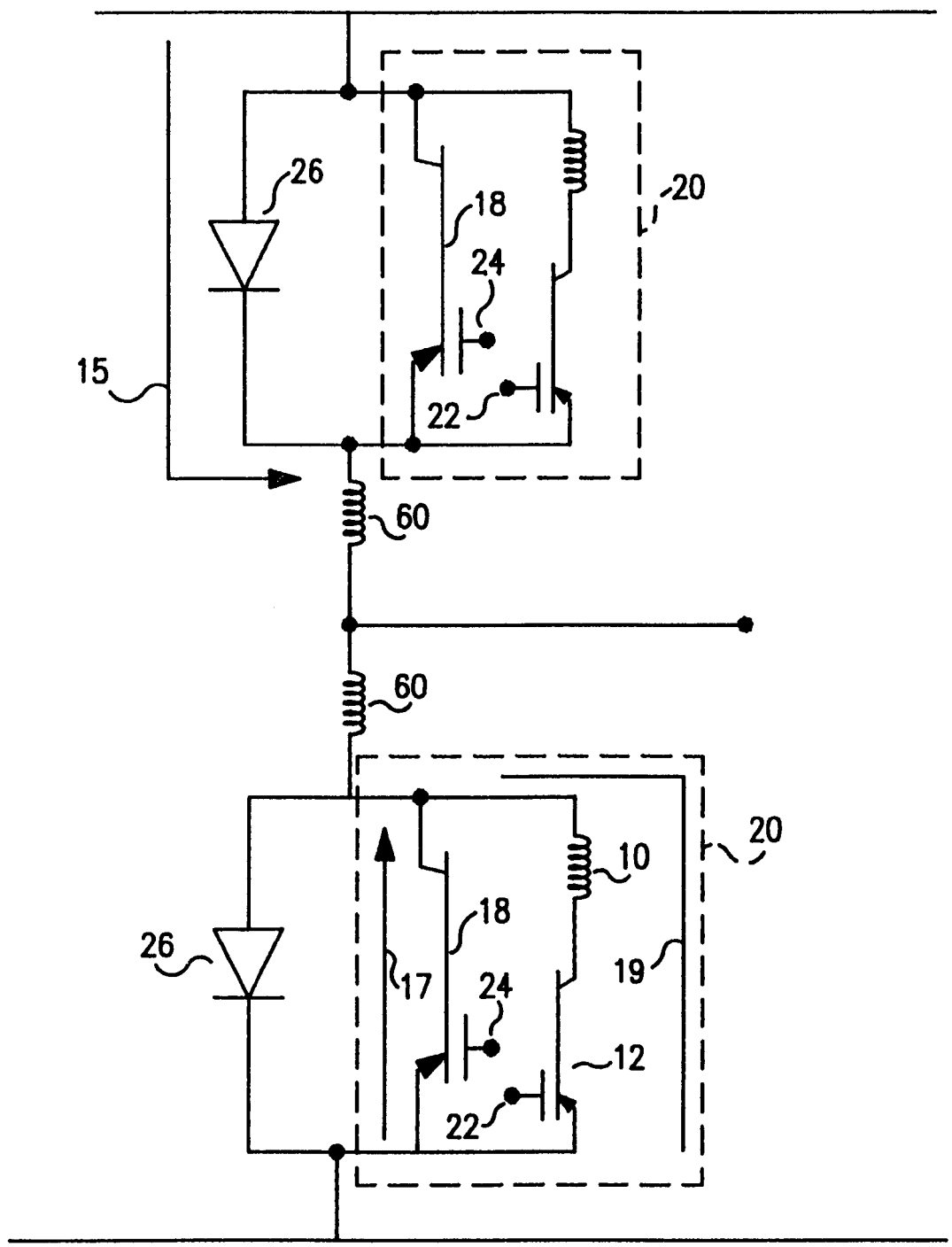
FIG. 1 is a schematic circuit diagram of a half-bridge circuit of the present invention showing two power switches in series, each with an antiparallel diode.

With reference now to FIG. 1, a half-bridge circuit includes two series connected power switch circuits 20 each having a main MCT switch 18 in parallel with an antiparallel diode 26. Although the antiparallel diode 26 is depicted as being outside of the switch circuit, in some semiconductor switch packages the diode is integral with the switch.

Within each of the power switch circuits 20, in parallel with the main MCT switch 18, is a series connected auxiliary MCT switch 12 and an inductor 10 circuit. The gates 22 and 24 of the main MCT switch 18 may be connected to suitable conventional circuitry which provides the appropriate gate voltage to both the main MCT switch 18 and the auxiliary MCT switch 12 to start the turn-on process. The auxiliary MCT 12 is desirably small in comparison to the main MCT 18 with a higher forward voltage drop than the main MCT switch 18. The auxiliary MCT switch 12 is desirably pulse rated for full system current plus the recovery current of the antiparallel diode.

The inductor circuit 10 has saturable characteristics and is large enough to protect the antiparallel diodes. Because the inductor circuit 10 does not carry the on-state current, it can be much smaller than it would otherwise have to be. Further, it may be chosen to be a much less expensive normal inductor which would not be possible if it were permanently in the circuit as in prior art di/dt snubbers.

In the operation of the half-bridge circuit of FIG. 1, the upper half of the bridge circuit containing the antiparallel diode 26 is turned off when the switch 20 in the lower half is turned on. Upon the initiation of the turn-off of the diode 28, the forward current 15 through the diode 26 drops as illustrated in FIG. 3.

Figure 3:
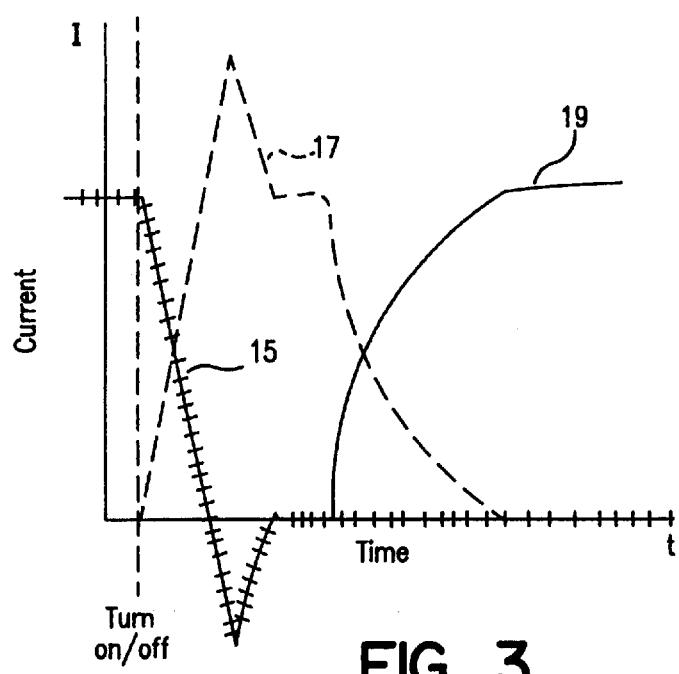
FIG. 3 is a graph showing the current at various places in the half-bridge circuit of FIG. 1.

As shown in FIG. 3, the initiation of the turn-on of switch 20, current is transferred out of the antiparallel diode 26 of the upper half of the bridge circuit into the switch 20 of the lower half of the bridge circuit. As shown in FIG. 3, the current 17 through the switch 20 is initially through the auxiliary MCT switch 12 and inductor circuit 10, and there is no current 19 through the main MCT switch 18.

The series connected small inductor and auxiliary MCT 12 provide a slower turn-on current rate as compared to the main MCT switch operating alone. The small inductor circuit 10 slows the current rate only until saturated, or until the main MCT switch 18 is turned on.

During the turn-on of the switch 20 in the lower half of the bridge circuit and the turn-off of the diode 26 in the upper half of the bridge circuit, the diode exhibits reverse recovery as shown in FIG. 3. The slower initial di/dt of the switch circuit 20 due to the auxiliary MCT switch 12 and inductor circuit 10 reduces the stress on the diode 26 in the upper half of the bridge circuit while such diode is in reverse recovery and prevents damage to the diode due to voltage snap.

In other words, the auxiliary MCT switch 12 and the inductor circuit 10 modify the transfer of current out of diode 26 of the upper half of the bridge circuit into the turned on switch 20 in the lower half of the bridge circuit.

When the main MCT switch 18 is fully turned on, it has a smaller forward voltage drop than the auxiliary MCT switch 12 and inductor circuit 10 and thus picks up substantially all of the current that was being carried by the auxiliary MCT-inductor circuit. Therefore, and as illustrated in FIG. 3, the auxiliary MCT switch 12 and inductor circuit 10 of the switch 20 in the lower half of the bridge circuit carry substantially all of the current of the switch 20 for the first few microseconds, and the main MCT switch 18 thereafter carries the bulk of the on-state current.

Switch 20 can be formed from discrete components or may be integrated into a monolithic device by well known integration techniques. Preferably, switch 20 would be a monolithic integrated circuit with an auxiliary MCT occupying no more than 10% of the die area of the main MCT switch 18 because, as discussed above, the auxiliary MCT-inductor circuit would carry little or no current through the main conduction cycle after being turned-on. The inductor circuit 10 may therefor small, inexpensive, and may easily be designed into the switch circuit. Alternatively, the inductor may be the normal type which would be robust thermally and not limited in temperature range.

Inductor 60 may be a conventional di/dt snubber and may be a discrete element within the half-bridge circuit or inherent within the circuit. The inductance it provides may be saturable or complex.

Figure 2:
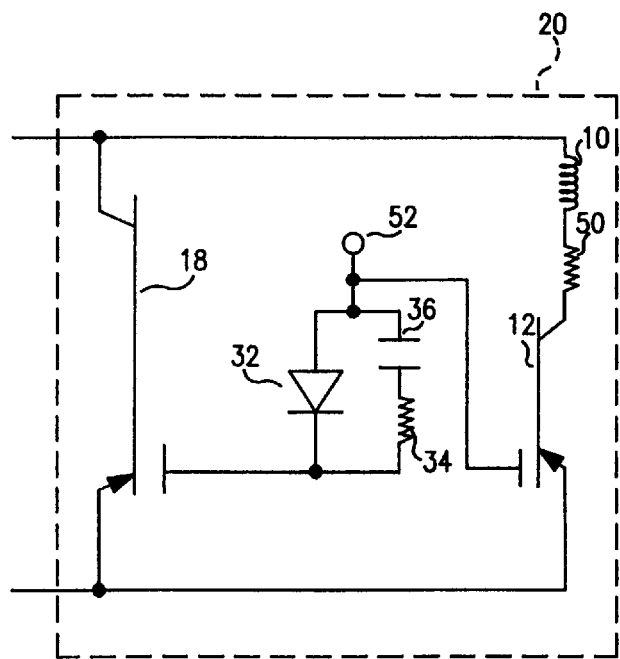
FIG. 2 is a schematic diagram of a second embodiment of the power switch in the circuit of FIG. 1.

In the alternative embodiment of the switch 20 shown in FIG. 2, the need for a second gate drive circuit may be obviated by a delay circuit. As shown in FIG. 2, this delay circuit may include a diode 32, a resistor 34, and a capacitor 36 to slow the turn-on signal to the gate 52 without slowing the turn-off signal thereto. The parameters of the delay circuit may be manipulated in a conventional fashion to vary the time differential between the turn-on of the main and auxiliary MCTS.

While the MCTs of FIGS. 1 and 2 are of a p-type switch, the circuit may easily be converted to an n-type complementary circuit in a manner well known in the art.

To ensure that the auxiliary MCT switch does not overheat as compared to the main MCT switch, the auxiliary MCT switch can be mounted with proportionally advantageous heat removal path in which case it could carry load current proportional to its area and therefore be used as a pilot for current sensing. Alternatively, and as illustrated in FIG. 2, the auxiliary MCT can be mounted with a small series resistance 50 to lower the current passing therethrough with respect to the current path through the main MCT. This resistor 50 may absorb almost all the losses and would reduce the losses in the inductor circuit and in the auxiliary MCT. The resistor 50 may also damp ringing and aid in transferring current into the main MCT when main MCT turns on.

Another alternative for ensuring that the auxiliary MCT transfers current quickly to the main MCT is to use an auxiliary MCT that has an inherently higher forward voltage drop due either to having had more lifetime killing or having a thicker active region.

The present invention works well with any power device in the location of the main power switch. In the location of the auxiliary switch, the preferred device is an MCT or GTO, or some other thyristor based device, including a regular SCR. With an SCR, the current in the auxiliary path must be brought below the holding current after the main power switch begins conducting and before main switch turn-off is needed.

The use of the present invention provides a cost-effective switch with a relatively high di/dt capability and protection for the antiparallel diode.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a bridge circuit having two series connected, fast operating power switches each with an antiparallel diode, the improvement comprising means for providing a current path in parallel with the fast operating power switch during the reverse recovery of the antiparallel diode, said parallel current path including a slower operating switch.

2. A semiconductor module including a half-bridge circuit comprising:
   a half-bridge circuit having two portions;
   each portion including in parallel:
   (i) a main MOS-controlled thyristor as a main switch,
   (ii) a diode, and (iii) a diode protection circuit for reducing stress on the diode in the other portion of the half-bridge circuit;

the diode protection circuit including in series:
(i) an auxiliary MOS-controlled thyristor with a substantially lower forward voltage drop than the main MOS-controlled thyristor, and
(ii) a saturable inductor; and each portion including means for delaying the turn-on of the main MOS-controlled thyristor relative to the auxiliary MOS-controlled thyristor and for simultaneously turning off both the main MOS-controlled thyristor and the auxiliary MOS-controlled thyristor.

3. In a half-bridge circuit having in series two alternately activated main MOS-controlled thyristors, each main MOS-controlled thyristor being in parallel with:
(i) a diode, and
(ii) an auxiliary MOS-controlled thyristor in series with an inductor, the method of operating the half-bridge circuit to reduce diode failure comprising the steps of:
(a) delaying activation of a main MOS-controlled thyristor relative to activating an auxiliary MOS-controlled thyristor in parallel with the main MOS-controlled thyristor; and
(b) simultaneously deactivating both the main MOS-controlled thyristor and the in parallel auxiliary MOS-controlled thyristor.

4. In a half-bridge circuit having two series connected MOS-controlled thyristors, each MOS-controlled thyristor hating a diode in parallel therewith each MOS-controlled thyristor, a protective device for reducing stress of the diode comprising:

alternate path means for providing an alternative path for the current through the half-bridge circuit during reverse recovery of said diodes; and control means for delaying the turn-on of a MOS-controlled thyristor relative to the turn-on of the alternate path means and for simultaneously turning off both the MOS-controlled thyristor and the alternate path means.

* * * * *